(12) United States Patent
Zheng et al.

(10) Patent No.: US 8,704,440 B2
(45) Date of Patent: Apr. 22, 2014

(54) LED LIGHTING DEVICE HAVING A PHOSPHOR COMPOSITION

(75) Inventors: Yi Zheng, Lynnfield, MA (US); Mary-Ann Johnson, Rockport, MA (US)

(73) Assignee: Osram Sylvania Inc., Danvers, MA (US)

( * ) Notice: Subject to any disclaimer, the term of this patent is extended or adjusted under 35 U.S.C. 154(b) by 85 days.

(21) Appl. No.: 13/176,952

(22) Filed: Jul. 6, 2011

(65) Prior Publication Data

US 2013/0009541 A1  Jan. 10, 2013

(51) Int. Cl.
*H01L 51/54* (2006.01)

(52) U.S. Cl.
USPC .......................... 313/503; 313/501

(58) Field of Classification Search
CPC ........... C09K 11/0883; C09K 11/7734; C09K 11/7774; H01J 1/63; H01L 33/502; Y02B 20/181
USPC ................................. 313/501–503
See application file for complete search history.

(56) References Cited

U.S. PATENT DOCUMENTS

| | | | |
|---|---|---|---|
| 7,820,075 B2 * | 10/2010 | Li et al. | 252/301.4 F |
| 8,143,777 B2 * | 3/2012 | Takano | 313/501 |
| 2005/0230689 A1 * | 10/2005 | Setlur et al. | 257/79 |
| 2008/0036364 A1 | 2/2008 | Li | |
| 2009/0015137 A1 * | 1/2009 | Su et al. | 313/503 |
| 2010/0224895 A1 | 9/2010 | Murazaki et al. | |
| 2012/0146078 A1 | 6/2012 | Baumann et al. | |

FOREIGN PATENT DOCUMENTS

WO  WO 2011/020751  2/2001
WO  WO 2011/022399  2/2011

OTHER PUBLICATIONS

Lei et al., Preparation and luminescence properties of green-light-emitting afterglow phosphor Ca8Mg(SiO4)4C12:Eu2+, Solid State Sciences 12 (2010) 2177-2181.

* cited by examiner

*Primary Examiner* — Andrew Coughlin
(74) *Attorney, Agent, or Firm* — Robert F. Clark

(57) ABSTRACT

There is herein described a phosphor composition for converting the light emitted from LED dies. The phosphor composition has an emission dominant wavelength responsive to an excitation dominant wavelength. The phosphor composition includes a first phosphor, a second phosphor and a third phosphor. The phosphor composition has a first weight ratio of the first phosphor and the second phosphor, and a second weight ratio of the second phosphor and the third phosphor. The first and second weight ratios are arranged so that the emission dominant wavelength increases as the excitation dominant wavelength increases.

8 Claims, 3 Drawing Sheets

LED LIGHTING DEVICE HAVING A PHOSPHOR COMPOSITION

TECHNICAL FIELD

This invention relates to light emitting diode ("LED") devices and lamps. In particular, this invention relates to LED devices and lamps containing the phosphor compositions for converting the light emitted from a light source into a light of different wavelengths.

BACKGROUND

Existing light emitting diodes ("LEDs") dies can emit light in the ultraviolet ("UV"), visible or infrared ("IR") wavelength range. Particularly, UV- and blue-emitting LED dies are commonly utilized for lighting purposes. Such LEDs may also be referred to herein by the color of the light they emit. For example, a blue-emitting LED may be called a blue LED and UV-emitting LED may be called a UV LED. (Similarly, the phosphors described herein may be referred to by the color of light that they emit upon excitation. For example, a yellow-emitting phosphor may be called a yellow phosphor, a green-emitting phosphor may be called a green phosphor, etc.) These LEDs generally have narrow emission spectra which mean that they can not be directly used to produce broad-spectrum light, such as white light with a high color rendering index ("CRI"). Phosphors can be introduced to convert a portion of the light originally emitted by the LED die into light of a different wavelength. The combination of the converted light and the originally emitted light renders a more desirable output light. For example, a white-emitting LED lighting device may contain a blue LED die and a yellow phosphor. The yellow phosphor partially absorbs the blue excitation light and converts it to a broad yellow emission. The combination of transmitted blue light and yellow light renders a white light. The quality of generated white light is determined by the intensity ratio of blue to yellow light and their spectral distributions. The characteristics of the generated white light can be quantitatively measured by color rendering index ("CRI"), correlated color temperature ("CCT"), and chromaticity coordinates ($C_x$, $C_y$) on a CIE 1931 color space chromaticity diagram.

Due to the LED die manufacturing process, there is bound to be certain performance variation among the LED dies, for example, in terms of spectral power distribution and emission dominant wavelength. For instance, the emission dominant wavelength of blue LED dies can have a wide distribution and usually ranges from 440 nm to 470 nm. Moreover, the power supplied to drive the LED die and the LED operating temperature may fluctuate during operation and cause an unstable emission spectrum. In contrast, phosphors have absorption peaks at pre-determined wavelengths. For example, a typical YAG:Ce phosphor has an absorption peak near 460 nm and the absorption and conversion decreases when the excitation wavelength deviates from 460 nm. When a single type of phosphor is applied onto LED dies with different emission dominant wavelengths, the output color of the LED device varies due to the difference in the phosphor absorption and conversion at the different excitation wavelengths.

SUMMARY OF THE INVENTION

It is an object of the invention to obviate the disadvantages of the prior art.

It is a further object of the invention to provide a phosphor composition and an LED lighting device containing the same. The phosphor composition is capable of self-adjusting the chromaticity in response to variations in the LED die excitation to provide a stable and homogeneous output color.

According to an embodiment, there is provided a phosphor composition for converting light emitted from LED dies. The phosphor composition has an emission dominant wavelength responsive to an excitation dominant wavelength. The phosphor composition includes a first phosphor, a second phosphor and a third phosphor. The phosphor composition has a first weight ratio of the first phosphor and the second phosphor and a second weight ratio of the second phosphor and the third phosphor. The first and second weight ratios are arranged so that the emission wavelength increases as the excitation dominant wavelength increases.

According to a related embodiment, the first and second weight ratios are further arranged so that the phosphor composition converts a first light having a first emission dominant wavelength into a second light having a second emission dominant wavelength, and the phosphor composition converts a third light have a third emission dominant wavelength into a fourth light having a fourth emission dominant wavelength, the third emission dominant wavelength being longer than the first emission dominant wavelength, the fourth emission dominant wavelength being longer than the second emission dominant wavelength.

According to another related embodiment, the first, second, third, and fourth lights respectively have chromaticities corresponding to first, second, third, and fourth x,y chromaticity points on a CIE 1931 color space chromaticity diagram, the first and second chromaticity points form a first line on the chromaticity diagram, the third and fourth chromaticity points form a second line on the chromaticity diagram, and the first and second weight ratios are further arranged so that the first and second lines have an intersecting point on the chromaticity diagram, and the intersecting point is substantially in close proximity of a black body locus of the CIE 1931 color space chromaticity diagram.

According to another embodiment, there is provided an LED lighting device. The LED lighting device includes at least one LED die emitting light and a phosphor composition for converting the light emitted from the LED die. The phosphor composition has an emission dominant wavelength responsive to an excitation dominant wavelength. The phosphor composition includes a first phosphor, a second phosphor, and a third phosphor. The phosphor composition has a first weight ratio of the first phosphor and the second phosphor and a second weight ratio of the second phosphor and the third phosphor. The first and second weight ratios are arranged so that the emission dominant wavelength increases as the excitation dominant wavelength increases According to a related embodiment, the LED lighting device has an output color temperature. The first and second weight ratios are further arranged so that the output color temperature is substantially the same as the excitation dominant wavelength increases.

According to another embodiment, there is provided an LED lighting device. The LED lighting device includes at least one LED die emitting light and a phosphor composition for converting the light emitted from the LED die. The phosphor composition has an emission dominant wavelength responsive to an excitation dominant wavelength. The phosphor composition includes a first phosphor, a second phosphor, and a third phosphor. The phosphor composition has a first weight ratio of the first phosphor and the second phosphor, and a second weight ratio of the second phosphor and the third phosphor. The first and second weight ratios are arranged so that the phosphor composition converts a first light having a first emission dominant wavelength into a second light having a second emission dominant wavelength, and the phosphor composition converts a third light have a third emission dominant wavelength into a fourth light having a fourth emission dominant wavelength, the third emission dominant wavelength being longer than the first emission dominant wavelength, the fourth emission dominant wavelength being longer than the second emission dominant wavelength.

The phosphor composition is capable of self-adjusting the chromaticity in response to the variations of the LED die excitation wavelengths. As the emission dominant wavelengths of the LED dies vary, the phosphor composition automatically adjusts its chromaticity in response. The resulting light output has a substantially constant chromaticity, regardless of the variation of LED wavelengths, while maintaining the target color temperature.

DETAILED DESCRIPTION

For a better understanding of the present invention, together with other and further objects, advantages and capabilities thereof, reference is made to the following disclosure and appended claims taken in conjunction with the above-described drawings.

In PA/cell a first embodiment, an LED lighting device may include one or more LED dies. The LED dies may be one or more blue or UV LED dies, preferably a blue LED die. The blue LED die, preferably an InGaN LED die, emits light at a wavelength at 430-485 nm. The emission dominant wavelength of the blue LED die can have a wide distribution and ranges from 440 nm to 470 nm, preferably from 446 nm to 462 nm. A phosphor composition is disposed to convert some of the original light emitted by the LED die into a converted light. The combination of the transmitted blue light and the converted light renders a white light with a target color temperature of about 5000K. The phosphor composition contains a mixture of three component phosphors. The first phosphor may be a green phosphor, preferably an orthosilicate phosphor. The chemical composition of the orthosilicate phosphor may be $(Sr, Ba, Ca, Eu)_2SiO_4$. The second phosphor may be a yellow phosphor, preferably a YAG:Ce phosphor. The chemical composition of the YAG:Ce phosphor may be $Y_3Al_5O_{12}$:Ce. The third phosphor may be a red phosphor, preferably a nitride phosphor. The chemical composition of the nitride phosphor may be $M_2Si_5N_8$:Eu (M=Sr, Ca, Ba). In the first embodiment, the weight ratio may be about 23:14:2 for the first, second and third phosphors; i.e., the weight ratio of the first and second phosphors is about 23:14, the weight ratio of the second and third phosphors is about 14:2. The emission dominant wavelengths are 549 nm, 574 nm and 603 nm for the first, second and third phosphors, respectively.

Figure 1:
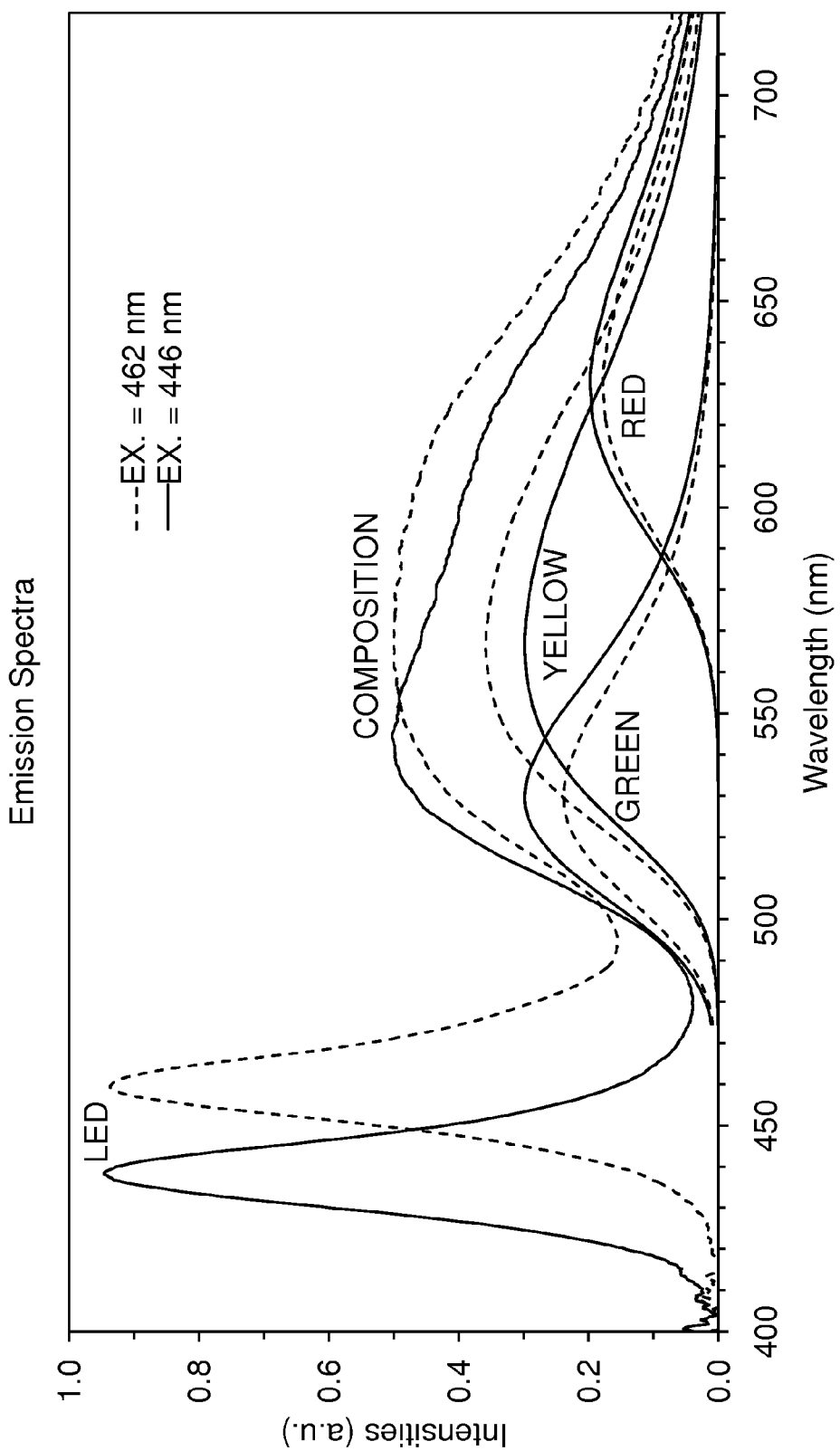
FIG. 1 shows the emission spectrum of an LED device containing a phosphor composition according to an embodiment of the invention upon the LED excitation at 446 nm and 462 nm; plotted along with the emission spectra of its component phosphors.

FIG. 1 shows an emission spectrum of the LED lighting device according to the present embodiment; plotted along with the emission spectra of its three component phosphors, labeled as "GREEN", "YELLOW", and "RED". The emission spectrum of the phosphor composition is labeled as "COMPOSITION". On the left side of FIG. 1 are two tall, narrow peaks that represent the transmitted emission peaks of two blue LED dies; one emits at 446 nm and the other emits at 462 nm. The transmitted emission spectra of the LED dies are labeled as "LED". Solid lines render spectra excited by a 446 nm LED emission; dashed lines render spectra excited by a 462 nm LED emission.

FIG. 1 shows that as the wavelength of the LED excitation increases from 446 nm to 462 nm, the intensities of the light emitted by the green and red phosphors decrease accordingly, while the intensity of the light emitted by the yellow phosphor increases accordingly. The emission spectrum of the phosphor composition is the combination of the emission spectra of three component phosphors. The resulting emission dominant wavelength of the phosphor composition increases from 570.5 nm to 573.8 nm, as the LED excitation dominant wavelength increases from 446 nm to 462 nm.

Figure 2:
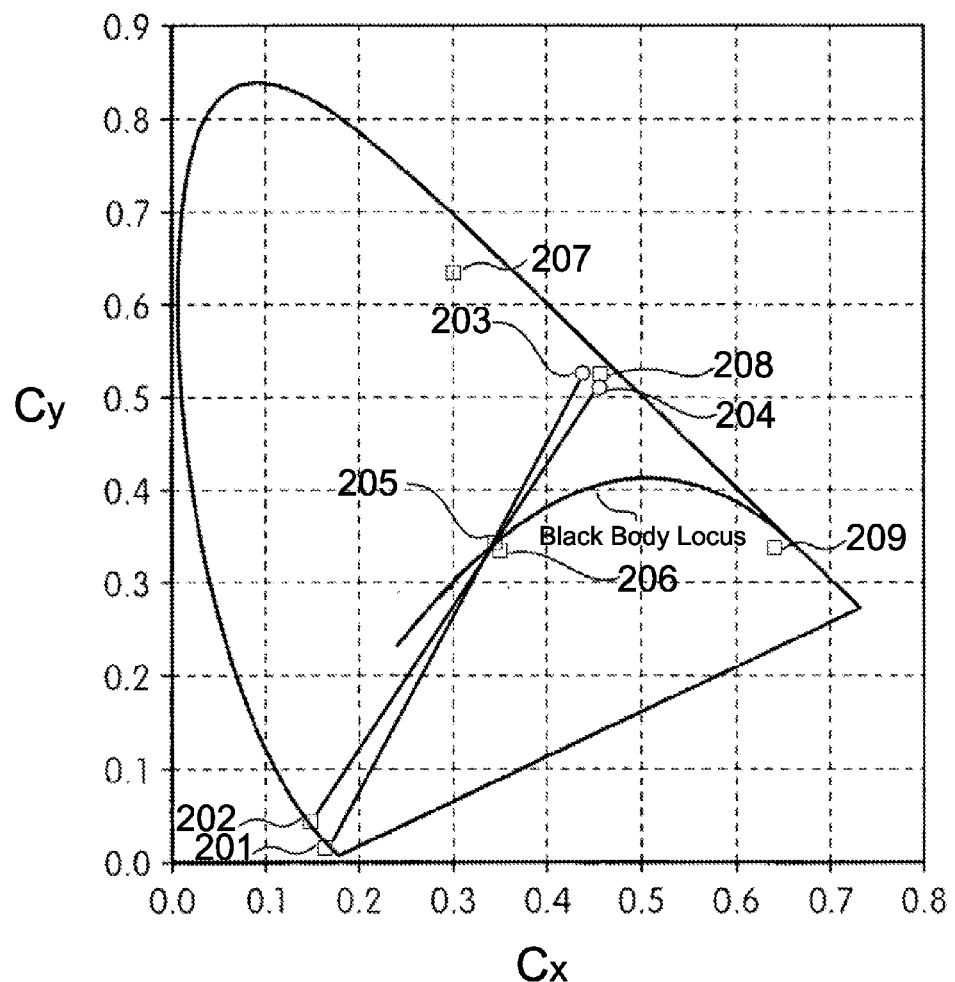
FIG. 2 is a CIE 1931 color space chromaticity diagram showing the emissions of LED dies and phosphors according to an embodiment of the invention.

Advantages of the present embodiment are better appreciated when data are viewed graphically on a CIE 1931 color space chromaticity diagram, as shown in FIG. 2. The CIE 1931 color space is one of the most widely used color spaces, created by the International Commission on Illumination (CIE) in 1931. The x,y chromaticities 201 and 202 are plotted at about (0.163, 0.019) and about (0.146, 0.042) on the chromaticity diagram for the blue light emitted from two LED dies emitting at 446 nm and 462 nm, respectively. The chromaticities of the component phosphors 207, 208 and 209 are shown at the coordinates of (0.301, 0.631), (0.464, 0.522) and (0.640, 0.359) for the green, yellow and red phosphors, respectively. A first line on the CIE chromaticity diagram connects chromaticity point 201 that corresponds to 446 nm emitted light from a blue LED die to point 203 lying in the yellow region of the diagram. The point 203 in the yellow region of the diagram corresponds to the emission of light from the phosphor composition upon excitation by the 446 nm light from the blue LED die. Similarly, a second line is drawn connecting point 202 that corresponds to 462 nm emitted light from a blue LED die to point 204 corresponding to the emission of light from the phosphor composition upon excitation at the 462 nm. These two lines each pass substantially through an intersecting point along the black body locus on the CIE chromaticity diagram, which corresponds to a desirable white output light with a target color temperature of about 5000K. The resulting chromaticities 205 and 206 of the combined output light of the lighting devices, upon the excitation by 446 nm and 462 nm respectively, are shown at (0.341, 0.350) and (0.347, 0.345) and are substantially near the black body locus on the chromaticity diagram.

The characteristics of the output light of the lighting device using the phosphor composition according to the present embodiment are shown in Table 1. As the excitation dominant wavelength from the blue LED die increases from 446 nm to 462 nm, the emission dominant wavelength of the phosphor composition increases accordingly so that the achieved correlated color temperature (CCT) is substantially 5000K with a small variation of 289K between the minimum and maximum CCT values. The chromaticity coordinates $C_x$ and $C_y$ vary only slightly in a range of 0.0077 and 0.0137, respectively, as the LED wavelength varies from 446 nm to 462 nm.

TABLE 1

| LED peak (nm) | Cx | Cy | CCT (K) | CRI | phosphor emission dominant wavelength (nm) |
|---|---|---|---|---|---|
| 446 | 0.3410 | 0.3496 | 5153 | 70.3 | 570.5 |
| 451 | 0.3393 | 0.3359 | 5189 | 75.7 | 571.9 |
| 456 | 0.3451 | 0.3432 | 4968 | 79.6 | 572.9 |
| 462 | 0.3470 | 0.3450 | 4900 | 83.7 | 573.8 |
| Variation | 0.0077 | 0.0137 | 289 | 13.4 | |

Alternatively, in a second embodiment, the materials for the three component phosphors and LED die may be the same as the first embodiment of Table 1. The first phosphor may be a green phosphor, preferably an orthosilicate phosphor. The chemical composition of the orthosilicate phosphor may be $(Sr, Ba, Ca, Eu)_2SiO_4$. The second phosphor may be a yellow phosphor, preferably a YAG:Ce phosphor. The chemical composition of the YAG:Ce phosphor may be $Y_3Al_5O_{12}$:Ce. The third phosphor may be a red phosphor, preferably a nitride phosphor. The chemical composition of the nitride phosphor may be $M_2Si_5N_8$:Eu (M=Sr, Ca, Ba). In this third embodiment, the weight ratio may be about 23:14:3 for the first, second and third phosphors. The phosphor composition is disposed to convert some of the original light emitted by the LED die into a converted light. The combination of the transmitted blue light and converted light renders a white light with a target color temperature of about 4000K.

The characteristics of the output light of the lighting device using the phosphor composition according to this second embodiment are shown in Table 2. As the excitation wavelength from the blue LED die increases from 446 nm to 462 nm, the achieved correlated color temp (CCT) is substantially 4000K with a small variation of 191K. The chromaticity coordinates $C_x$ and $C_y$ vary only slightly in a range of 0.0068 and 0.0054, respectively, as the LED wavelength varies from 446 nm to 462 nm.

TABLE 2

| LED peak (nm) | Cx | Cy | CCT (K) | CRI | phosphor emission dominant wavelength (nm) |
|---|---|---|---|---|---|
| 446 | 0.3784 | 0.3600 | 3925 | 75.9 | 575.1 |
| 451 | 0.3800 | 0.3550 | 3834 | 78.7 | 576.0 |
| 456 | 0.3852 | 0.3604 | 3734 | 81.5 | 576.8 |
| 462 | 0.3843 | 0.3583 | 3740 | 84.7 | 577.6 |
| Variation | 0.0068 | 0.0054 | 191 | 8.8 | |

Alternatively, in a third embodiment, the materials for the three component phosphors and LED die may be the same as the first embodiment of Table 1. The first phosphor may be a green phosphor, preferably an orthosilicate phosphor. The chemical composition of the orthosilicate phosphor may be $(Sr, Ba, Ca, Eu)_2SiO_4$. The second phosphor may be a yellow phosphor, preferably a YAG:Ce phosphor. The chemical composition of the YAG:Ce phosphor may be $Y_3Al_5O_{12}$:Ce. The third phosphor may be a red phosphor, preferably a nitride phosphor. The chemical composition of the nitride phosphor may be $M_2Si_5N_8$:Eu (M=Sr, Ca, Ba). In this third embodiment, the weight ratio may be about 26:14:6 for the first, second and third phosphors. The phosphor composition is disposed to convert some of the original light generated by the LED die into a converted light. The combination of the transmitted blue light and converted light renders a white light with a target color temperature of about 2700K.

The characteristics of the output light of the lighting device using the phosphor composition according to this third embodiment are shown in Table 3. As the excitation wavelength from the blue LED die increases from 446 nm to 462 nm, the achieved correlated color temp (CCT) is substantially 2700K with a small variation of 162K. The chromaticity coordinates Cx and Cy vary only slightly in a range of 0.0130 and 0.0094, respectively, as the LED wavelength varies from 446 nm to 462 nm.

TABLE 3

| LED peak (nm) | Cx | Cy | CCT (K) | CRI | phosphor emission dominant wavelength (nm) |
|---|---|---|---|---|---|
| 446 | 0.4381 | 0.3763 | 2742 | 80.3 | 581.1 |
| 451 | 0.4511 | 0.3804 | 2580 | 79.5 | 582.3 |
| 456 | 0.4422 | 0.3710 | 2629 | 81.3 | 582.6 |
| 462 | 0.4465 | 0.3727 | 2580 | 81.7 | 583.3 |
| Variation | 0.0130 | 0.0094 | 162 | 2.2 | |

In a fourth embodiment, an LED lighting device may include one or more LED dies. The LED dies may be one or more blue or UV LED dies, preferably a blue LED die. The blue LED die, preferably an InGaN LED die, emits light at a wavelength of about 430-485 nm. The emission dominant wavelength of the blue LED die can have a wide distribution and ranges from 440 nm to 470 nm, preferably from 446 nm to 462 nm. A phosphor composition is disposed to convert some of the original light generated by the LED die into a converted light. The combination of the transmitted blue light and converted light renders a white light. The phosphor composition has a mixture of three component phosphors. The first phosphor may be a green phosphor, preferably a silicate phosphor. The chemical composition of the silicate phosphor may be $(Sr, Ba, Ca, Eu)_2SiO_4$. The second phosphor may be a yellow phosphor, preferably a YAG:Ce phosphor. The chemical composition of the YAG:Ce phosphor may be $Y_3Al_5O_{12}$:Ce. The third phosphor may be a red phosphor, preferably a nitride phosphor. The chemical composition of the nitride phosphor may be $M_2Si_5N_8$:Eu (M=Sr, Ca, Ba). The weight ratio may be about 21:21:6 for the first, second and third phosphors.

The characteristics of the output light of the lighting device using the phosphor composition according to this fourth embodiment are shown in Table 4. As the excitation wavelength from the blue LED die increases from 446 nm to 462 nm, the achieved correlated color temp (CCT) has a small variation of 56K. The chromaticity coordinates $C_x$ and $C_y$ vary only slightly in a range of 0.0133 and 0.0144, respectively, as the LED wavelength varies from 446 nm to 462 nm.

TABLE 4

| LED peak (nm) | Cx | Cy | CCT (K) | CRI |
|---|---|---|---|---|
| 446 | 0.4822 | 0.4077 | 2394 | 71.3 |
| 451 | 0.4796 | 0.4057 | 2410 | 71.6 |
| 456 | 0.4725 | 0.3997 | 2450 | 73.1 |
| 462 | 0.4858 | 0.4141 | 2400 | 73.7 |
| Variation | 0.0133 | 0.0144 | 56 | 2.4 |

Alternatively, in a fifth embodiment, the materials for the three component phosphors and LED die may be the same as the fourth embodiment of Table 4. The first phosphor may be a green phosphor, preferably a silicate phosphor. The chemical composition of the silicate phosphor may be $(Sr, Ba, Ca, Eu)_2SiO_4$. The second phosphor may be a yellow phosphor, preferably a YAG:Ce phosphor. The chemical composition of the YAG:Ce phosphor may be $Y_3Al_5O_{12}$:Ce. The third phosphor may be a red phosphor, preferably a nitride phosphor. The chemical composition of the nitride phosphor may be $M_2Si_5N_8$:Eu (M=Sr, Ca, Ba). In this fifth embodiment, the weight ratio may be about 21:19:2 for the first, second and third phosphors. The phosphor composition is disposed to convert some of the original light generated by the LED die into a converted light. The combined transmitted blue light and converted light render a white light.

The characteristics of the output light of the lighting device using the phosphor composition according to this fifth embodiment are shown in Table 5. As the excitation wavelength from the blue LED die increases from 446 nm to 462 nm, the achieved correlated color temp (CCT) has a small variation of 154K. The chromaticity coordinates $C_x$ and $C_y$ vary only slightly in a range of 0.0107 and 0.0144, respectively, as the LED wavelength varies from 446 nm to 462 nm.

TABLE 5

| LED peak (nm) | Cx | Cy | CCT (K) | CRI |
| --- | --- | --- | --- | --- |
| 446 | 0.4013 | 0.4048 | 3698 | 66.1 |
| 451 | 0.4010 | 0.3993 | 3663 | 68.5 |
| 456 | 0.4013 | 0.4003 | 3664 | 76.8 |
| 462 | 0.4117 | 0.4137 | 3544 | 73.1 |
| Variation | 0.0107 | 0.0144 | 154 | 10.7 |

Alternatively, in a sixth embodiment, the materials for the three component phosphors and LED die may be the same as the fourth embodiment of Table 4. The first phosphor may be a green phosphor, preferably a silicate phosphor. The chemical composition of the silicate phosphor may be (Sr, Ba, Ca, $Eu)_2SiO_4$. The second phosphor may be a yellow phosphor, preferably a YAG:Ce phosphor. The chemical composition of the YAG:Ce phosphor may be $Y_3Al_5O_{12}$:Ce. The third phosphor may be a red phosphor, preferably a nitride phosphor. The chemical composition of the nitride phosphor may be $M_2Si_5N_8$:Eu (M=Sr, Ca, Ba). In this fifth embodiment, the weight ratio may be about 21:15:1 for the first, second and third phosphors. The phosphor composition is disposed to convert some of the original light generated by the LED die into a converted light. The combination of the transmitted blue light and converted light renders a white light.

The characteristics of the output light of the lighting device using the phosphor composition according to this sixth embodiment are shown in Table 6. As the excitation wavelength from the blue LED die increases from 446 nm to 462 nm, the achieved correlated color temp (CCT) has a small variation of 232K. The chromaticity coordinates $C_x$ and $C_y$ vary only slightly in a range of 0.0061 and 0.0149, respectively, as the LED wavelength varies from 446 nm to 462 nm.

TABLE 6

| LED peak (nm) | Cx | Cy | CCT (K) | CRI |
| --- | --- | --- | --- | --- |
| 446 | 0.3367 | 0.3367 | 5321 | 64.5 |
| 451 | 0.3376 | 0.3393 | 5272 | 69.4 |
| 456 | 0.3390 | 0.3422 | 5219 | 74.2 |
| 462 | 0.3428 | 0.3516 | 5089 | 77.7 |
| Variation | 0.0061 | 0.0149 | 232 | 13.2 |

Figure 3:
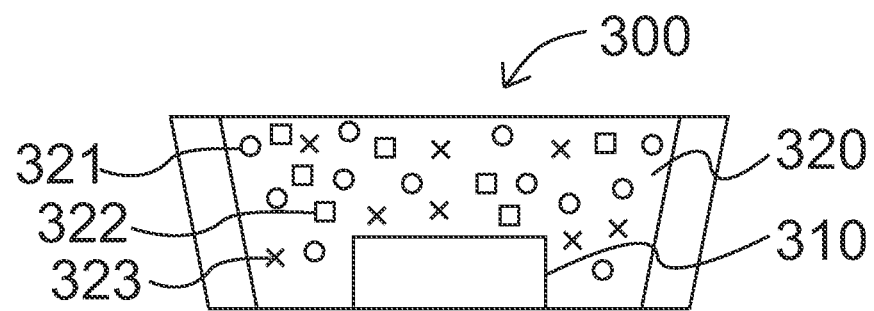
FIG. 3 is a schematic illustration of an LED lighting device according to an embodiment of the present invention.

With reference to FIG. 3, a LED lighting device 300, in accordance with another embodiment of the invention is shown. LED lighting device 300 comprises at least one LED die 310 emitting light and a phosphor composition 320 dispersed in a transparent matrix 320. The phosphor composition converts the light emitted from the LED die and comprises a first phosphor 321, a second phosphor 322 and a third phosphor 323. The phosphor composition has a first weight ratio of first phosphor 321 and second phosphor 322, and a second weight ratio of second phosphor 322 and third phosphor 323. The first and second weight ratios are arranged so that the phosphor composition converts a first light having a first emission dominant wavelength into a second light having a second emission dominant wavelength, and converts a third light having a third emission dominant wavelength into a fourth light having a fourth emission dominant wavelength, the third emission dominant wavelength being longer than the first emission dominant wavelength, the fourth emission dominant wavelength being longer than the second emission dominant wavelength.

It is essential to have at least three component phosphors to achieve both the target color temperature, and the optimized emission peak shift for the phosphor composition to compensate the LED wavelength shift; so that the combined output light has substantially stabilized color characteristics such as chromaticity and color temperature as the LED excitation wavelength varies.

Considering a composition of only two component phosphors, the weight ratio of the two component phosphors, which is a single variable, controls the emission dominant wavelength of the composition, and therefore further controls the color temperature of the output light. Meanwhile the very same variable of the weight ratio also controls the amount of emission peak shift for the composition upon the LED excitation shift. If the weight ratio is determined to achieve the target color temperature, the resulting emission peak shift may be too small or too large, or in the opposite direction, to compensate the LED wavelength shift. Thus, the combined output light has no stabilized color characteristics such as chromaticity. If the weight ratio is determined to optimize the emission peak shift to compensate for the LED wavelength shift, the resulting output color temperature may deviate from the target color temperature.

A phosphor composition of three component phosphors solves the above-mentioned dilemma. The weight ratio of three component phosphors has two variables, namely a first ratio of components 1 and 2, as well as a second ratio of components 2 and 3. The two variables can be adjusted to achieve both the target color temperature and the optimized emission peak shift simultaneously. As shown in the previous embodiments, without changing any component phosphors, both target color temperature and stabilized color chromaticity can be achieved simultaneously just by changing the two variables of the weight ratio of the three component phosphors.

Moreover, a phosphor composition having three component phosphors can cover a larger range of correlated color temperature (CCT) than a phosphor composition having two component phosphors. For example, a composition of two component phosphors containing green and yellow phosphors can only achieve cool or neutral white; and a composition of two component phosphors containing yellow and red phosphor can only achieve warm white. In contrast, a phosphor composition having three component phosphors can achieve a correlated color temperature of from cool to warm white. Moreover, the color rendering index (CRI) of the output light is generally higher for a composition of three component phosphors. In addition, there are more possibilities of blend mixture compositions from three component phosphors than two component phosphors to achieve certain target color characteristics.

While the principles of the invention have been described herein, it is to be understood by those skilled in the art that this description is made only by way of example and not as a limitation as to the scope of the invention. Reference numerals corresponding to the embodiments described herein may be provided in the following claims as a means of convenient reference to the examples of the claimed subject matter shown in the drawings. It is to be understood however, that the reference numerals are not intended to limit the scope of the claims. Other embodiments are contemplated within the scope of the present invention in addition to the exemplary embodiments shown and described herein. Modifications and substitutions by one of ordinary skill in the art are considered to be within the scope of the present invention, which is not to be limited except by the recitations of the following claims.

What is claimed is:

1. An LED lighting device comprising:
   at least one LED die and a phosphor composition;
   the at least one LED die emitting a blue light that excites the phosphor composition, the blue light having an excitation dominant wavelength in a range from 440 nm to 470 nm;
   the phosphor composition having an emission dominant wavelength responsive to the excitation dominant wavelength, the phosphor composition comprising a first phosphor, a second phosphor and a third phosphor, the phosphor composition having a first weight ratio of the first phosphor and the second phosphor, and a second weight ratio of the second phosphor and the third phosphor, the first and second weight ratios being arranged so that the emission dominant wavelength of the phosphor composition increases as the excitation dominant wavelength increases; and
   the LED lighting device having an output light, the first and second weight ratios being further arranged so that the output light exhibits a substantially stabilized chromaticity and a substantially stabilized color temperature in response to variations in the excitation dominate wavelength within the range.

2. The LED lighting device of claim 1, wherein the range is from 446 nm to 462 nm.

3. The LED lighting device of claim 2, wherein the first phosphor is a silicate phosphor, the second phosphor is a YAG:Ce phosphor and the third phosphor is a nitride phosphor.

4. The LED lighting device of claim 3, wherein the silicate phosphor is a $(Sr, Ba, Ca, Eu)_2SiO_4$ phosphor, the YAG:Ce phosphor is a $Y_3Al_5O_{12}$:Ce phosphor and the nitride phosphor is a $M_2Si_5N_8$:Eu (M=Sr, Ca, Ba) phosphor.

5. The LED lighting device of claim 4, wherein the first weight ratio is from about 26:14 to about 23:14 and the second weight ratio is from about 14:2 to about 14:6.

6. The LED lighting device of claim 5, wherein the first weight ratio is about 23:14 and the second weight ratio is about 14:2.

7. The LED lighting device of claim 5, wherein the first weight ratio is about 23:14 and the second weight ratio is about 14:3.

8. The LED lighting device of claim 5, wherein the first weight ratio is about 26:14 and the second weight ratio is about 14:6.

* * * * *